（12）United States Patent
Hoentschel et al.

(10) Patent No.: US 8,062,952 B2
(45) Date of Patent: Nov. 22, 2011

(54) STRAIN TRANSFORMATION IN BIAXIALLY STRAINED SOI SUBSTRATES FOR PERFORMANCE ENHANCEMENT OF P-CHANNEL AND N-CHANNEL TRANSISTORS

(75) Inventors: Jan Hoentschel, Dresden (DE); Stefan Flachowsky, Dresden (DE); Andy Wei, Dresden (DE)

(73) Assignee: GLOBAL FOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/784,819

(22) Filed: May 21, 2010

(65) Prior Publication Data
US 2010/0301416 A1 Dec. 2, 2010

(30) Foreign Application Priority Data
May 29, 2009 (DE) .......................... 10 2009 023 237

(51) Int. Cl.
*H01L 21/30* (2006.01)
(52) U.S. Cl. ....................................... 438/424
(58) Field of Classification Search .................. None
See application file for complete search history.

(56) References Cited

U.S. PATENT DOCUMENTS

| 7,217,608 | B1 | 5/2007 | Xiang | 438/199 |
|---|---|---|---|---|
| 7,282,402 | B2 | 10/2007 | Sadaka et al. | 438/221 |
| 2005/0285187 | A1* | 12/2005 | Bryant et al. | 257/335 |
| 2007/0190741 | A1* | 8/2007 | Lindsay | 438/424 |
| 2007/0262385 | A1 | 11/2007 | Nguyen et al. | 257/351 |
| 2009/0191679 | A1* | 7/2009 | Ouyang et al. | 438/276 |

OTHER PUBLICATIONS

Translation of Official Communication from German Patent Office for German Patent Application No. 10 2009 023 237.0-33 dated Mar. 14, 2010.

* cited by examiner

*Primary Examiner* — Charles Garber
*Assistant Examiner* — Andre' C Stevenson
(74) *Attorney, Agent, or Firm* — Williams, Morgan & Amerson

(57) ABSTRACT

In advanced SOI devices, a high tensile strain component may be achieved on the basis of a globally strained semiconductor layer, while at the same time a certain compressive strain may be induced in P-channel transistors by appropriately selecting a height-to-length aspect ratio of the corresponding active regions. It has been recognized that the finally obtained strain distribution in the active regions is strongly dependent on the aspect ratio of the active regions. Thus, by selecting a moderately low height-to-length aspect ratio for N-channel transistors, a significant fraction of the initial tensile strain component may be preserved. On the other hand, a moderately high height-to-length aspect ratio for the P-channel transistor may result in a compressive strain component in a central surface region of the active region.

22 Claims, 5 Drawing Sheets

STRAIN TRANSFORMATION IN BIAXIALLY STRAINED SOI SUBSTRATES FOR PERFORMANCE ENHANCEMENT OF P-CHANNEL AND N-CHANNEL TRANSISTORS

BACKGROUND OF THE INVENTION

1. Field of the Invention

Generally, the present disclosure relates to the field of integrated circuits, and, more particularly, to the manufacture of transistors having strained channel regions by using stress-inducing sources, such as globally strained silicon substrates and the like, in order to enhance charge carrier mobility in the channel region of a MOS transistor.

2. Description of the Related Art

Generally, a plurality of process technologies are currently practiced to fabricate integrated circuits, wherein, for complex circuitry, such as microprocessors, storage chips and the like, CMOS technology is presently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode located in close proximity to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region is a dominant factor determining the performance of MOS transistors. Thus, the reduction of the channel length, and associated therewith the reduction of the channel resistivity, is an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. For instance, the thickness of the gate insulation layer, typically an oxide-based dielectric, has to be reduced with reducing the gate length, wherein a reduced thickness of the gate dielectric may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects with oxide-based gate dielectric scaling being pushed to the limits with respect to tolerable leakage currents. It has, therefore, been proposed to also enhance the channel conductivity of the transistor elements by increasing the charge carrier mobility in the channel region for a given channel length, thereby offering the potential for achieving a performance improvement that is comparable with the advance to technology nodes using reduced gate lengths while avoiding or at least postponing many of the problems encountered with the process adaptations associated with device scaling.

One efficient mechanism for increasing the charge carrier mobility is the modification of the lattice structure in the channel region, for instance, by creating tensile or compressive stress in the vicinity of the channel region so as to produce a corresponding strain in the channel region, which results in a modified mobility for electrons and holes, respectively. For example, creating uniaxial tensile strain in the channel region along the channel length direction for a standard crystallographic orientation increases the mobility of electrons, which in turn may directly translate into a corresponding increase in the conductivity. On the other hand, uniaxial compressive strain in the channel region for the same configuration as above may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semi-conductor material, which may enable the fabrication of fast powerful semiconductor devices without requiring expensive semiconductor materials, while many of the well-established manufacturing techniques may still be used.

In some approaches, external stress created by, for instance, permanent overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like into the channel region to create the desired strain therein. Thus, for different transistor types, differently stressed overlayers have to be provided, which may result in a plurality of additional process steps, wherein, in particular, any additional lithography steps may significantly contribute to the overall production costs. Moreover, the amount of stress-inducing material and, in particular, the intrinsic stress thereof may not be arbitrarily increased without requiring significant design alterations.

In other approaches, a strain-inducing semiconductor alloy may be provided within drain and source regions, which may exert a specified type of stress on the channel region to thereby induce a desired type of strain therein. For example, a silicon/germanium alloy may frequently be used for this purpose in order to obtain a compressive stress component in the adjacent channel region of, for instance, P-channel transistors in order to increase mobility of holes in the corresponding P-channel. In sophisticated applications, two or more of the above-specified strain-inducing mechanisms may be combined so as to further enhance the overall strain obtained in the corresponding channel regions. However, these strain-inducing mechanisms may be considered as "local" mechanisms, since the strain may be induced in and above the corresponding active region for the transistor element under consideration, wherein the finally obtained strain component in the channel region may significantly depend on the overall device dimensions. That is, typically, these local strain-inducing mechanisms may rely on the stress transfer capabilities via other device components, such as gate electrodes, spacer elements formed on sidewalls of the gate electrodes, the lateral dimensions of the drain and source regions and the like. Consequently, the magnitude of the strain in the channel region may significantly depend on the technology under consideration, since, typically, reduced device dimensions may result in an over-proportional reduction of the corresponding strain-inducing mechanism. For example, creating strain by a dielectric overlayer, such as a contact etch stop layer, may frequently be used, wherein, however, the amount of internal stress of the corresponding dielectric material may be restricted by deposition-related constraints while at the same time, upon reducing device dimensions, for instance the spacing between two neighboring transistor elements, may require a significant reduction of the layer thickness, which may thus result in a reduction of the finally obtained strain component. For these reasons, typically, the magnitude of the strain in the channel region provided by the local strain-inducing mechanisms may be several hundred MPa, while a further increase of this value may be difficult to be achieved upon further device scaling.

For this reason, attention is again increasingly drawn to other mechanisms in which a moderately high degree of strain may be created in a global manner, i.e., on a wafer level, so that the corresponding active regions of the transistor elements may be formed in a globally strained semiconductor material, thereby providing a "direct" strain component in the corresponding channel regions. For instance, as one of the earliest strain techniques, a silicon material may be epitaxially grown on an appropriately designed "buffer layer" in order to obtain a strained silicon layer. For example, a silicon/germanium buffer layer which may be provided with its substantially natural lattice constant may be used for forming thereon a strained silicon layer, which may have a moderately high tensile biaxial strain of 1 GPa or higher, depending on the lattice mismatch between the buffer layer and the strained silicon layer. For example, a substantially relaxed silicon/germanium layer having a fraction of approximately 20 atomic percent germanium may result in a tensile biaxial strain of a corresponding epitaxially grown silicon material of 1.3 GPa, which is significantly higher compared to the strain levels obtained by the local strain-inducing mechanisms described above. The global biaxial strain in the silicon results in an increase of the degree of degeneration of the conduction band, thereby creating two sets of sub-valleys with different effective electron masses. An appropriate repopulation of the theses energy states thus leads to a higher electron mobility and hence a higher drive current of N-channel transistors.

The creation of a global strained silicon layer may also be efficiently accomplished on the basis of a silicon-on-insulator (SOI) architecture by sophisticated wafer bonding techniques. That is, a strained silicon layer may be formed on the basis of an appropriately designed buffer layer, as explained above, and the corresponding silicon layer may be bonded to a carrier wafer having formed thereon a silicon dioxide layer. After the bonding of the strained silicon layer to the carrier wafer, the strained semiconductor layer may be cleaved, for instance, by incorporating an appropriate species, such as hydrogen, helium and the like, wherein the previously generated strain may be substantially maintained due to the adhesion of the strained silicon material on the material of the carrier wafer. Consequently, a globally strained silicon layer may also be provided in applications in which SOI architecture may be required, at least for performance driven transistor elements.

Providing a globally strained silicon layer may be considered as a very promising approach for forming highly strained transistor elements, for instance, on the basis of an SOI architecture. A further increase of performance of complex CMOS devices may, however, also demand an appropriate strain engineering for P-channel transistors, for which the biaxial tensile strain of the globally applied silicon layer may result in a performance degradation. In this case, the difference in charge carrier mobility between N-channel transistors and P-channel transistors may be even further increased, thereby contributing to a further increased imbalance of performance behavior in complex CMOS devices, thereby rendering this approach less attractive for sophisticated applications. It has been observed, however, that a further increase of the global tensile strain level in strained SOI substrates, which may be achieved by using a higher germanium concentration in the silicon/germanium buffer layer, the hole mobility may exhibit a slight increase. These high strain levels, however, are difficult to achieve due to a significantly increased probability of creating dislocations, which may result in a relaxation mechanism of the strain above a certain critical thickness of the semiconductor layer. An increased level of dislocations, however, may result in a reduction of overall transistor performance, thereby reducing or even offsetting the advantages in N-channel transistors obtained by providing a globally strained silicon layer. On the other hand, it is very difficult to provide a globally compressively strained semiconductor layer, for instance, on the basis of a silicon/carbon buffer layer, since appropriate deposition techniques for growing a silicon/carbon alloy are very difficult to control on the basis of volume production regimes.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and semiconductor devices in which an efficient strain-inducing mechanism may be established by providing a globally strained silicon-based semiconductor material, which may provide superior strain conditions for one type of transistor of a CMOS device. A negative effect of the global strain component on the other type of transistor elements may be significantly reduced or an appropriate strain component may be generated within a portion of corresponding active regions by appropriately selecting the geometry of the active region. It has been recognized that a modification of the global strain component may occur upon defining active regions in the globally strained semiconductor layer on the basis of trench isolation structures due to an interaction of the isolation structure with the strained semiconductor material within the active region. According to the principles disclosed herein, the degree of strain modification may be determined on the basis of an aspect ratio, i.e., of a ratio of a height and a length of an active region, thereby providing the possibility of appropriately adjusting the type and magnitude of the resulting strain component locally within individual active regions. In some illustrative aspects disclosed herein, the aspect ratio of an active region of a transistor element requiring a strain component that is opposite with respect to the global strain component of the initial semiconductor layer may be selected such that a desired strain component may be obtained at least within a portion of a channel region of the transistor, thereby compensating for or even over-compensating for any effect of the global strain component. For example, for a given thickness of the initial silicon-based semiconductor material, an appropriate length of the active region may be selected so as to obtain the desired opposite strain component in at least a portion of the channel region. Similarly, the active regions of transistor elements requiring a strain component corresponding to the initial global strain component may be appropriately designed so as to obtain a superior overall performance, for instance, by reducing the relative influence of the trench isolation structure with respect to reducing the initial global strain component. Consequently, in some illustrative embodiments, performance of N-channel transistors and P-channel transistors may be enhanced on the basis of a single global strain component, thereby contributing to reduced production costs compared to CMOS devices having the same performance accomplished on the basis of local strain engineering techniques.

One illustrative method disclosed herein comprises providing a silicon-containing semiconductor layer above a substrate, wherein the silicon-containing semiconductor layer has a biaxial strain of a first type. The method further comprises forming a trench isolation structure in the silicon-containing semiconductor layer so as to define an active region having a surface region with a biaxial strain of a second type that differs from the first type. Additionally, the method comprises forming a transistor element of a first conductivity type in and above the active region, wherein the surface region represents a portion of a channel region of the transistor element.

A further illustrative method disclosed herein comprises forming a first active region and a second active region in a strained silicon-containing semiconductor layer formed above a substrate of a semiconductor device. The first active region has a first aspect ratio of height and length so as to obtain a strain component of opposite type relative to an initial type of strain of the silicon-containing semiconductor layer, at least in a central surface region of the first active region. Moreover, the second active region is formed so as to have a second aspect ratio in order to preserve the initial type of strain, at least in a central surface region of the second active region. The method further comprises forming a first transistor in and above the first active region with a channel region comprising at least a portion of the central surface region of the first active region. Additionally, the method comprises forming one or more transistors in and above the second active region with a channel region comprising at least a portion of the central surface region of the second active region.

One illustrative semiconductor device disclosed herein comprises a first trench isolation structure formed in a silicon-containing semiconductor layer, wherein the first trench isolation structure laterally delineates a first active region having a first height-to-length aspect ratio and comprising a first central surface area having a strain of a first type, wherein the first active region further comprises a first central body region having a strain of a second type that is different from the first type. The semiconductor device further comprises a second trench isolation structure formed in the silicon-containing semiconductor layer and laterally delineating a second active region having a second height-to-length aspect ratio that is less than the first height-to-length aspect ratio. The second active region comprises a second central surface area having a strain of the second type, wherein the second active region further comprises a second central body region having a strain of the second type. The semiconductor device further comprises a first transistor formed in and above the first active region, wherein a portion of a channel region of the first transistor is formed in the first central surface area. Finally, the semiconductor device comprises a second transistor formed in and above the second active region, wherein a portion of a channel region of the second transistor is formed in the second central surface area.

BRIEF DESCRIPTION OF THE DRAWINGS

The disclosure may be understood by reference to the following description taken in conjunction with the accompanying drawings, in which like reference numerals identify like elements, and in which.

Figure 1A:
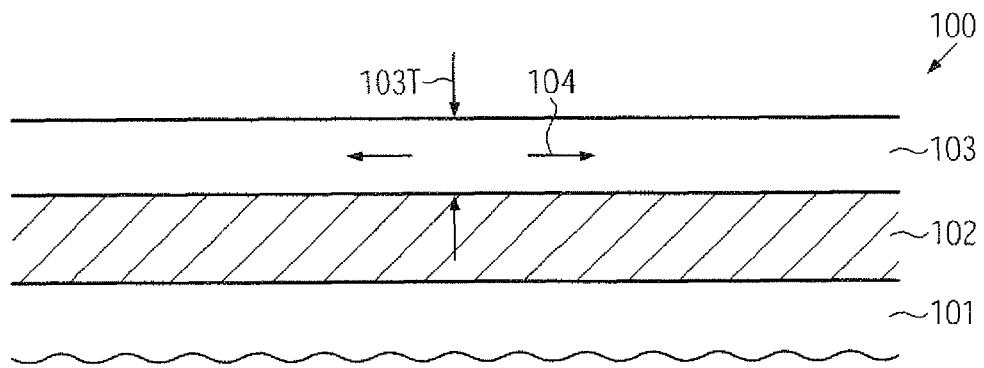
FIG. 1a schematically illustrates a cross-sectional view of a semiconductor device including a globally strained silicon-based semiconductor layer formed on a buried insulating material, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides techniques and semiconductor devices comprising sophisticated transistor elements which may be formed on the basis of a globally strained semiconductor material, which, in some illustrative embodiments, may be provided on a buried insulating layer, wherein a moderately high fraction of the initial strain component may be preserved during the various manufacturing stages for one type of transistor, while a negative influence of the initial strain component may be reduced or may even be "transformed" into an opposite strain component for the other type of transistor. For this purpose, the aspect ratio of active regions for forming therein the transistor elements may be appropriately selected in order to appropriately adjust the degree of modification of the initially provided strain component. That is, according to the principles disclosed herein, the thickness of the globally strained semiconductor layer, in combination with a length of an active region, which is to be understood as a lateral dimension corresponding to a current flow direction of a transistor to be formed in the active region, may have a significant influence on the degree of local strain obtained within the active region after forming the corresponding trench isolation structure that delineates the active region. Without intending to restrict the present application to the following explanation, it is assumed that the process of forming shallow trench isolations creates free surface areas, which may thus relax the strain component in the strained semiconductor layer of an SOI device. Elastic mechanical interactions between the patterned semiconductor material, which is bonded to the buried insulating layer, and the free surface areas obtained by forming the trenches for the isolation structure result in a significant modification of the initially provided strain component, which may even cause a strain component of a different type of strain within a central surface area of the active region by appropriately selecting the geometrical dimensions, i.e., the height and the length of the active region. Consequently, by appropriately selecting the layout of the semiconductor device under consideration, critical transistor elements may be formed on the basis of appropriately selected aspect ratios for the active regions in order to obtain enhancement of performance of different transistor types, thereby significantly increasing the overall performance of complex CMOS devices. That is, the active regions for N-channel transistors may be formed on the basis of an appropriate target aspect ratio that may provide a minor modification of the initial strain component, which may be a tensile strain component, as previously explained, thereby providing very efficient N-channel transistors without requiring extremely sophisticated local strain engineering techniques. On the other hand, the aspect ratio for a P-channel transistor may be selected such that a significant reduction of the initial tensile strain component may be accomplished while, in some cases, even a compressive strain component may be induced in an area that may correspond to a portion of the channel region of the transistor. Consequently, performance of the P-channel transistor may be increased without requiring additional strain-inducing mechanisms. For example, as previously explained, in some cases, extremely high biaxial strain components may have to be provided in order to obtain a slight improvement of P-channel transistor performance, which, however, may be very difficult to achieve without causing significant lattice dislocations in the semiconductor material due to the high germanium concentration that may typically be required for obtaining the high biaxial tensile strain components.

In some illustrative embodiments disclosed herein, an appropriate aspect ratio may be adjusted by varying the length of the corresponding active regions for a given initial thickness of the silicon-based semiconductor material. In this manner, superior process conditions may be obtained during the complex manufacturing processes for patterning the gate electrode structure and the like. In other illustrative embodiments disclosed herein, additionally or alternatively to varying the length of active regions, the thickness and thus the height of the active regions may be used as a parameter for obtaining a desired aspect ratio, thereby providing superior flexibility in designing the overall layout of the device under consideration. For example, for an initial tensile strain component, the thickness of the silicon-based semiconductor layer may be selectively reduced for N-channel transistors, thereby obtaining a desired aspect ratio that is advantageous with respect to reducing a degree of modification of the initial tensile strain component. At the same time, the reduced thickness of the active region may further result in a superior performance of N-channel transistors for otherwise identical critical dimensions, such as gate length and the like. On the other hand, the initial thickness of the semiconductor layer may be selected so as to provide a significant modification or even conversion of the initial strain component locally within the active region of P-channel transistors. If desired, in other cases, in addition to reducing the thickness of the active regions of N-channel transistors, the thickness of the P-channel transistors may be increased, for instance, by epitaxially growing additional material on the active region, thereby providing an even further increased degree of flexibility in providing superior strain conditions for the different types of transistors.

It should be appreciated that the principles disclosed herein may be very advantageous with respect to a silicon-based semiconductor material of an SOI device in which initially a tensile strain component may be provided. As discussed above, moderately high tensile strain components in SOI devices may be obtained on the basis of well-established manufacturing techniques based on appropriate buffer layers, such as silicon/germanium buffer layers, silicon/tin buffer layers, silicon/germanium/tin buffer layers and the like, which may be formed on a donor substrate in order to form a strained silicon-based semiconductor material thereon, which may subsequently be bonded to a carrier substrate while the buffer layer may be removed. In other cases, the buffer layer may still be maintained, if considered appropriate. However, the principles disclosed herein may also be applied to substrates and semiconductor devices in which the initial silicon-based semiconductor material may be provided in the form of a compressively strained material, if appropriate process techniques for forming a compressively strained semiconductor layer may be available.

FIG. 1a schematically illustrates a cross-sectional view of a semiconductor device 100 in an early manufacturing stage. The device 100 may comprise a substrate 101 which may represent any appropriate carrier material for forming thereabove a silicon-based semiconductor layer 103. Moreover, in the embodiment shown, the device 100 may comprise a buried insulating layer 102, such as a silicon dioxide layer and the like, which may have any appropriate material composition and thickness in order to obtain the desired performance of semiconductor devices to be formed in and above the semiconductor layer 103. In the embodiment shown, the semiconductor layer 103 may be provided so as to exhibit a specific strain component 104, which may also be referred to as a global strain component, since the strain level obtained by the component 104 may prevail in a significant portion of the semiconductor layer 103, i.e., the strain component 104 may be present within an area that may comprise at least a plurality of active regions still to be defined in the semiconductor layer 103 in a later manufacturing stage. A magnitude of the strain component 104 may be in the range of several hundred mega Pascal (MPa) to one giga Pascal (GPa) or higher, depending on the available process techniques for forming appropriate buffer layers, as previously explained. Furthermore, the semiconductor layer 103 may have an initial thickness 103T which may be appropriate for forming sophisticated SOI transistor elements, such as fully or partially depleted SOI transistors, depending on the overall device requirements. For example, the thickness 103T may range from approximately 10-100 nm or more, wherein, in some illustrative embodiments, the thickness 103T may be substantially preserved during the further processes, except for a certain degree of material loss caused by typical processes, such as aggressive wet chemical cleaning processes, oxidation processes which may be performed so as to form any pad oxide layers and the like. In other illustrative embodiments, the thickness 103T, which may accommodate additional process-related variations, may be re-adjusted locally in order to enhance overall strain conditions, as will be described later on in more detail with reference to FIGS. 2a-2d.

The semiconductor device 100 as illustrated in FIG. 1a may be formed on the basis of well-established process techniques, which may include the formation of an appropriate buffer layer, such as a silicon/germanium layer, which may be formed such that at least a surface area thereof may have substantially the natural lattice constant of the silicon/germanium material in order to act as an appropriate template material for growing thereon a silicon-based material in a strained state, as is also previously explained. Moreover, a corresponding strained silicon material may be bonded to a carrier substrate, such as the substrate 101, while a remaining portion of the initially used substrate may be removed by any appropriate and well-established process techniques. It should be appreciated that, in other cases (not shown), a corresponding buffer layer may be incorporated in the semiconductor layer 103, if considered appropriate with respect to the overall electronic characteristics of transistor elements to be formed in and above the semiconductor layer 103. Consequently, the strain component 104 may be adjusted on the basis of well-established process techniques, thereby contributing to a very efficient overall manufacturing process flow.

Figure 1B:
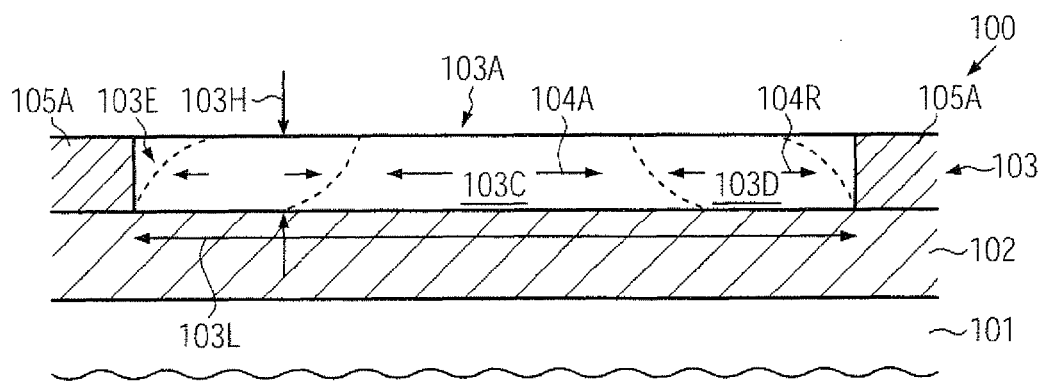
FIGS. 1b-1d schematically illustrate cross-sectional views of semiconductor devices comprising trench isolation structures for defining active regions with different height-to-length aspect ratios in order to obtain a different degree of strain modification within the active regions, according to illustrative embodiments.

FIG. 1b schematically illustrates a cross-sectional view of the device 100 in a further advanced manufacturing stage. As illustrated, the device 100 may comprise an active region 103A formed in the semiconductor layer 103. Generally, an active region may be understood as a semiconductor region of the layer 103, in which one or more PN junctions may be formed on the basis of a corresponding dopant profile in order to establish at least one controllable current path within the active region 103A. In the embodiment shown, a current flow direction of a transistor element to be formed in and above the active region 103A may be referred to as a length direction, indicated as 103L, which may thus represent a length of the active region 103A. It should be appreciated that a corresponding width of the active region 103A may represent a direction perpendicular to the drawing plane of FIG. 1b and may represent a width of a corresponding transistor element to be formed in and above the active region 103A. Furthermore, the active region 103A may have a "height" 103H, which may be related to the initial thickness 103T of FIG. 1a, since the height 103H may substantially correspond to the thickness 103T except for any process-related material removal which may occur when forming the active region 103A. The active region 103A may be laterally delineated by an isolation structure 105A, which may be provided in the form of a trench isolation structure that may extend down to the buried insulating layer 102. The isolation structure 105A may comprise any appropriate material for electrically insulating the active region 103A from any neighboring active regions of the semiconductor layer 103.

The isolation structure 105A may be formed on the basis of well-established process techniques, wherein an appropriate lithography mask may be used to define the position and size, i.e., the length 103L and a corresponding width of the active region 103A in accordance with design rules of the device 100. As will be explained later on in more detail, the overall size of the active region 103A may be adjusted with respect to desired strain conditions to be established therein, since the degree of strain modification may strongly depend on the geometry of the active region 103A, i.e., on the height-to-length aspect ratio of the active region 103A. Thus, in the embodiment shown, for a given initial thickness 103T (FIG. 1a) and thus for a given height 103H, the corresponding aspect ratio may be appropriately adjusted by selecting an appropriate length 103L, which may be accomplished by forming trenches for the isolation structure 105A on the basis of a corresponding lithography mask. For example, after forming any sacrificial material layers, such as a pad oxide, a chemical mechanical polishing (CMP) stop layer and the like, trenches may be formed by lithography and subsequently a desired insulating material, such as silicon dioxide, silicon nitride and the like, may be filled into the trenches according to any desired process strategy. Consequently, during the patterning of the corresponding trenches, "free" surface areas may be formed within the semiconductor layer 103 which may subsequently be brought into contact with the insulating material of the isolation structure 105A. Consequently, after removing any excess material and possibly incorporating a desired dopant species for defining the basic conductivity type of the active region 103A, the initial strain level in the active region 103A may differ from the initial strain level 104 as shown in FIG. 1a. For example, in a central body region 103C, a moderately high tensile strain component 104A may still be present, which, however, may be slightly reduced compared to the initial strain component 104. On the other hand, peripheral areas 103D may exhibit a reduced strain component 104R due to the interaction between the isolation structure 105A and the active region 103A. Moreover, at an edge region 103E, the initial strain component 104 may be even further reduced or may even be balanced, while, in other cases, even a certain degree of compressive strain component may be present, depending on the characteristics of the isolation structure 105A. It has been recognized that the strain distribution within the active region 103A strongly depends on a combination of the height 103H and the length 103L for a given initial strain component. For example, in FIG. 1b, a moderately low height-to-length aspect ratio may provide a relatively high tensile strain component 104A at the central portion 103C, thereby also providing a moderately high tensile strain component for a transistor element to be formed in and above the active region 103A, when a channel region thereof is positioned above the central portion 103C. On the other hand, a corresponding strain distribution would not be desirable for a P-channel transistor if the active region 103A represents an N-doped semiconductor region.

Figure 1C:
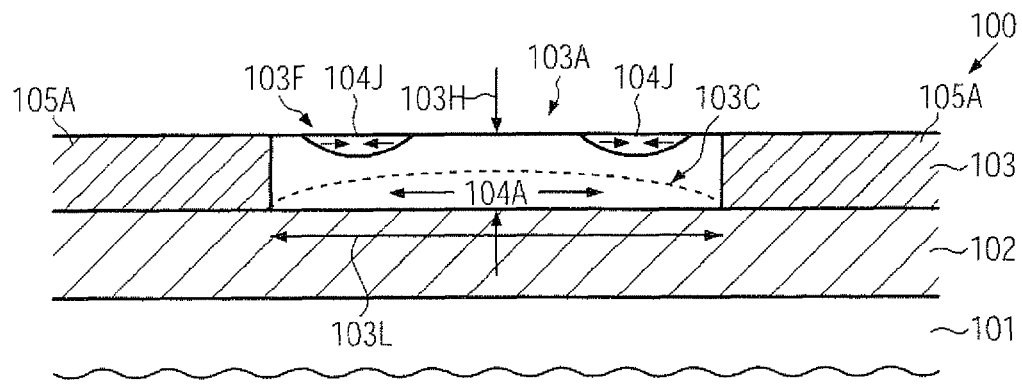

FIG. 1c schematically illustrates the semiconductor device 100 according to a different configuration in which the active region 103A may have a greater height-to-length aspect ratio due to a reduced length 103L for the given height 103H. In this case, the initial strain component 104 (FIG. 1a) may be further reduced in the central body region 103C, while at the same time even a certain compressive strain component 104J may occur at peripheral surface regions 103F. Consequently, the resulting strain distribution in the active region 103A of FIG. 1c may be more appropriate for forming a P-channel transistor therein compared to the configuration of FIG. 1b.

Figure 1D:
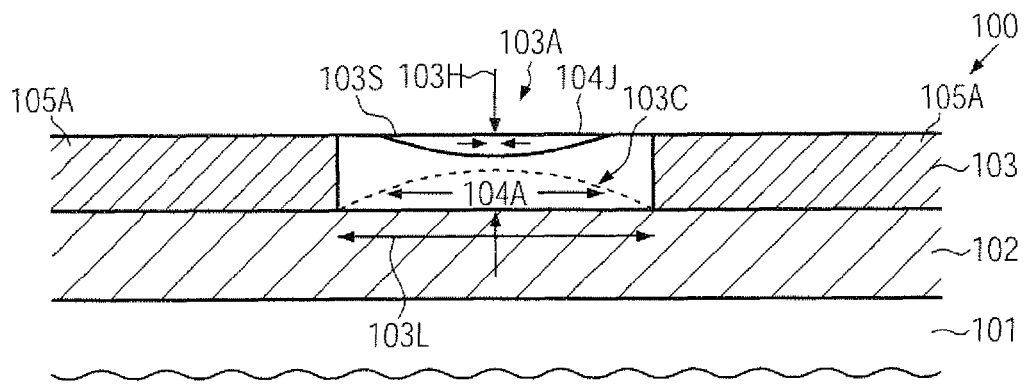

FIG. 1d schematically illustrates the semiconductor device 100 in a configuration in which the active region 103A may have an even further reduced height-to-length aspect ratio, which may be accomplished by further reducing the length 103L upon appropriately dimensioning the trench isolation structure 105A. As illustrated, a central surface region 103S may be formed above the central body region 103C that may still have a tensile strain component 104A, however, with an even further reduced magnitude compared to the configuration of FIG. 1c. Moreover, the central surface region 103S, which may be considered as being formed by "pushing" the regions 103F of FIG. 1c towards the center of the active region 103A, may comprise the compressive strain component 104J, which may have an increased magnitude compared to the configuration of FIG. 1c. Thus, for given initial characteristics of the semiconductor layer 103, i.e., an initial thickness and strain level thereof, the aspect ratio of the active region 103A as shown in FIG. 1d may be appropriate for forming a P-channel transistor in and above the active region 103A, since, in this case, a corresponding channel region may comprise a portion of the central surface region 103S having the desired compressive strain component, thereby enhancing charge carrier mobility and thus drive current capability therein.

It should be appreciated that an appropriate height-to-length aspect ratio for the active region 103A, when representing a P-channel transistor for an initial tensile strain component, may be readily determined on the basis of experiments in which different length values may be realized for a plurality of active regions for one or more initial conditions of the semiconductor layer 103. In this case, an appropriate length 103L may be selected which may still be compatible with the design rules of the device 100 and which may result in a desired compressive strain component. For example, for an aspect ratio of 0.4 to 0.5, the central region may receive a compressive strain component of several ten MPa for an initial tensile strain of approximately 1 GPa. For an aspect ratio of approximately 0.9 to 1.0, a compressive strain level of approximately 100 MPa may be achieved. These strain values may be obtained for an initial thickness of the layer 103 of approximately 40-100 nm. Similarly, an appropriate aspect ratio may be selected for N-channel transistors in order to obtain a moderately high tensile strain component, i.e., selecting an aspect ratio that may result in a reduced modification of the strain distribution, while also respecting the design rules of the device 100. For instance, with the above-specified preconditions, a tensile strain level of approximately 800-1000 MPa may be maintained in the central area for an aspect ratio of approximately 0.1 or less. For example, the basic circuit layout of the device 100 may be appropriately adapted such that a desired low height-to-length aspect ratio may be realized for N-channel transistors, while P-channel transistors may be formed on the basis of an active region of reduced length in order to obtain the desired compressive strain component. For example, a plurality of N-channel transistors may be formed in and above a single active region having a low height-to-length aspect ratio so that a moderately high strain component may be realized for each of the N-channel transistors without unduly consuming semiconductor area.

Figure 1E:
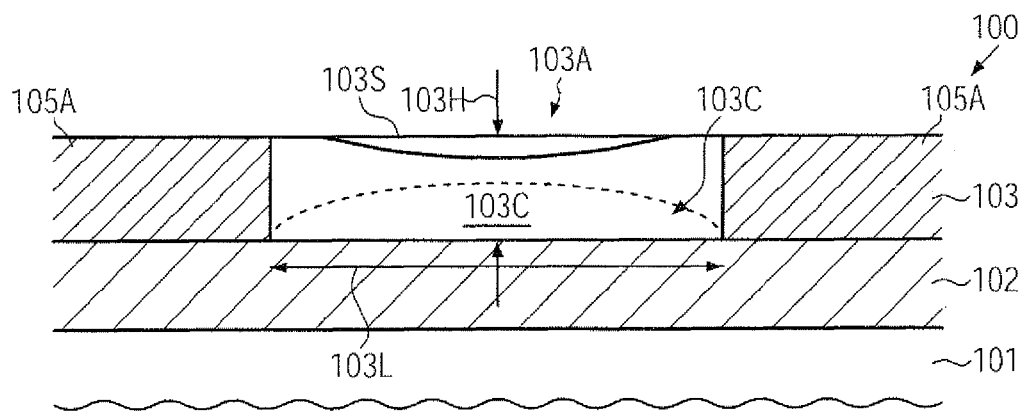
FIG. 1e schematically illustrates a cross-sectional view of a semiconductor device in which the height-to-length aspect ratio may be adjusted on the basis of an increased layer thickness, according to further illustrative embodiments.

FIG. 1e schematically illustrates the semiconductor device 100 according to further configurations in which an increased value for the length 103L may be selected compared to the configuration of FIG. 1d in order to provide superior design flexibility, for instance, for forming two or more P-channel transistors in and above the active region 103A, while, in other cases, a single P-channel transistor may be formed with an increased length of corresponding drain and source regions compared to the configuration of FIG. 1d. In this case, the height 103H may be appropriately adapted so as to obtain the central surface region 103S with the desired strain component. As will be described later on, the height 103H may be locally adapted for P-channel transistors and N-channel transistors in order to obtain a desired strain distribution while also respecting certain design and layout constraints.

Figure 1F:
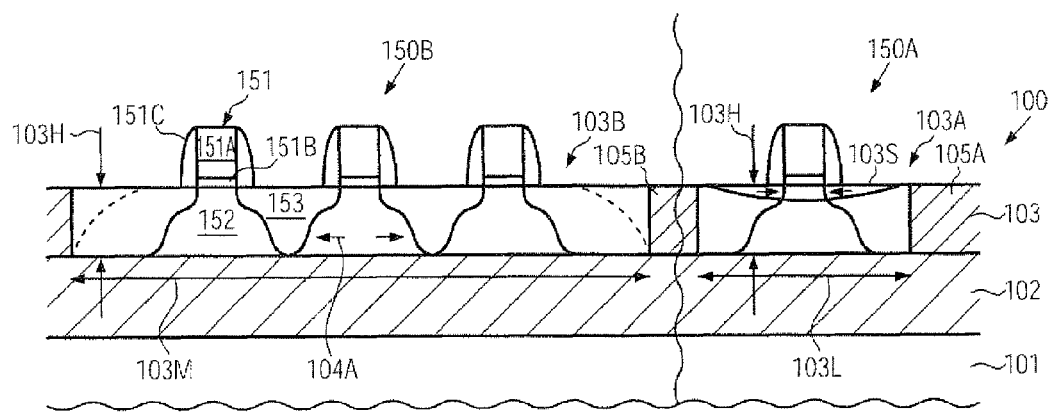
FIG. 1f schematically illustrates a cross-sectional view of the semiconductor device in a further advanced manufacturing stage comprising active regions for different transistor types, wherein each active region may have an appropriate aspect ratio in order to enhance performance of the corresponding transistor elements, according to still further illustrative embodiments.

FIG. 1f schematically illustrates the semiconductor device 100 in a further advanced manufacturing stage. As illustrated, a first transistor 150A may be formed in and above the active region 103A and may represent a P-channel transistor when the initial strain component 104 (FIG. 1a) of the semiconductor layer 103 is a tensile strain. In this case, the height-to-length aspect ratio may be selected such that the central surface region 103S may be created with a desired compressive strain component, as discussed above. On the other hand, the device 100 may comprise a second active region 103B, which may represent an active region for forming therein and thereabove N-channel transistors, which may require a tensile strain component, such as the strain component 104A, as previously explained with reference to FIG. 1b. Consequently, the active region 103B may have an appropriate height-to-length aspect ratio so as to preserve a significant portion of the initial tensile strain component in the semiconductor layer 103. In the embodiment shown, the height values 103H of the active regions 103A, 103B may be substantially the same, except for any process-related deviations. That is, the height levels 103H may be obtained on the basis of the initial thickness of the layer 103 and any process-related material removal without intentionally modifying the thickness of the semiconductor material. Consequently, a length 103M of the active region 103B may be significantly greater compared to the length 103L, wherein an appropriate value for the length values 103L, 103M may be readily determined on the basis of a process strategy, as described above. For example, the length 103M may be selected to be approximately 300-800 nm, while the length 103L may be selected to be approximately 200 nm and significantly less. It should be appreciated, however, that other length values may have to be selected in accordance with the height 103H and the overall configuration of the transistors 150A, 150B. For example, the transistors 150A, 150B may comprise a gate electrode structure 151 including an electrode material 151A, a gate dielectric material 151B and a spacer structure 151C, wherein the gate electrode structure 151 may substantially determine a length of a channel region 152, which in turn may have a significant influence on the overall transistor behavior, as previously explained. Moreover, drain and source regions 153 may be formed in the transistors 150A, 150B on the basis of an appropriate dopant profile, as previously discussed.

The semiconductor device 100 as illustrated in FIG. 1f may be formed on the basis of the following processes. After selecting an appropriate target aspect ratio for the active regions 103A, 103B and forming the isolation structure 105A and an isolation structure 105B on the basis of the appropriate target aspect ratios, the further processing may be continued by establishing a desired basic dopant profile in the active regions 103A, 103B, followed by the deposition of materials for the gate electrode structures 151. For this purpose, any appropriate manufacturing strategy may be applied, for instance, by forming an oxide-based dielectric material followed by the deposition of an electrode material, such as silicon, silicon/germanium and the like. In other cases, the gate dielectric material 151B may be formed on the basis of a high-k dielectric material, which is to be understood as a dielectric material having a dielectric constant of 10.0 or higher. Furthermore, if desired, a metal-containing electrode material may be provided in the electrode material 151A. During the patterning of the gate materials, a corresponding gate length may be adjusted on the basis of sophisticated lithography and etch techniques, wherein a corresponding gate length may be approximately 50 nm and significantly less if very sophisticated semiconductor devices are considered. Next, the drain and source regions 153 may be formed, possibly in combination with the spacer structure 151C on the basis of ion implantation techniques and the like, depending on the overall requirements of the device 100. Thereafter, the dopant species may be activated and implantation-induced crystal damage may be reduced by performing one or more anneal processes. Thereafter, if required, a metal silicide may be formed in the drain and source regions 153 and also in the gate electrode material 151A, when comprising a significant portion of a silicon species. Next, an interlayer dielectric material may be deposited above the transistors 150A, 150B which, in some illustrative embodiments, may comprise a highly stressed dielectric material to even further enhance overall performance of at least one of the transistors 150A, 150B. For example, a compressively stressed dielectric material may be deposited above the transistor 150A, which may be accomplished on the basis of well-established deposition techniques. Similarly, a tensile stressed dielectric material may be deposited above the transistors 150B, if required.

Thereafter, a further dielectric material may be deposited and may be planarized and patterned in order to form contact elements so as to connect to the transistors 150A, 150B. In some cases, prior to completing the interlayer dielectric material, the gate electrode material 151A may be replaced by a metal-containing electrode material in order to further enhance overall performance of the transistors 150A, 150B.

As previously explained, since the charge carrier mobility in the channel regions 152 may significantly depend on the strain conditions therein, superior performance of the transistors 150B may be accomplished due to a moderately high tensile strain component 104A. On the other hand, the central surface region 103S having the compressive strain component may represent at least a portion of the channel region 152 of the transistor 150A, thereby also contributing to enhanced performance of this transistor, which may thus reduce any performance imbalance between P-channel transistors and N-channel transistors formed on the basis of a globally tensile strained semiconductor material. Consequently, a very efficient and cost-effective manufacturing strategy may be accomplished on the basis of a globally strained semiconductor material.

Figure 1G:
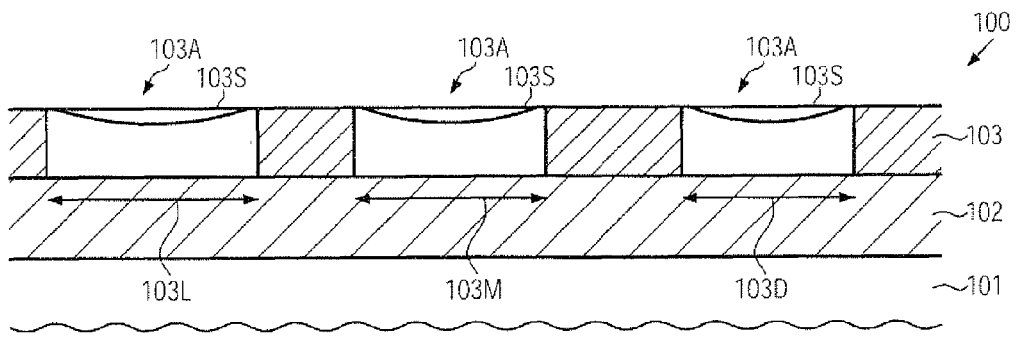
FIG. 1g schematically illustrates a cross-sectional view of a semiconductor device in an early manufacturing stage in which a plurality of active regions may be provided, each of which may have a surface area of an opposite strain component compared to the initial strain component for forming a plurality of individual transistor elements, according to illustrative embodiments.

FIG. 1g schematically illustrates the semiconductor device 100 according to further illustrative embodiments in which a plurality of active regions 103A may be provided, each of which may comprise the central surface region 103S having the desired compressive strain component. Moreover, the active regions 103A may have different height-to-length aspect ratios due to different length values 103L, 103M, 103D so as to provide a high degree of flexibility in varying overall transistor characteristics. For example, a reduced strain level may be obtained in the central surface region 103S for the benefit of an increased length of the active region 103A, thereby enabling the formation of transistor elements having less critical design dimensions with respect to a length of corresponding drain and source regions. Hence, superior conditions for forming contact elements may be accomplished, for instance, for device regions including a high density of transistor elements, while nevertheless efficiently reducing or even overcompensating for a negative influence of an initial global strain component.

With reference to FIGS. 2a-2d, further illustrative embodiments will now be described in which, in addition to or alternatively to varying a length of active regions, a height thereof may be adapted in order to obtain a desired height-to-length aspect ratio for achieving the desired strain distribution in the active regions.

Figure 2A:
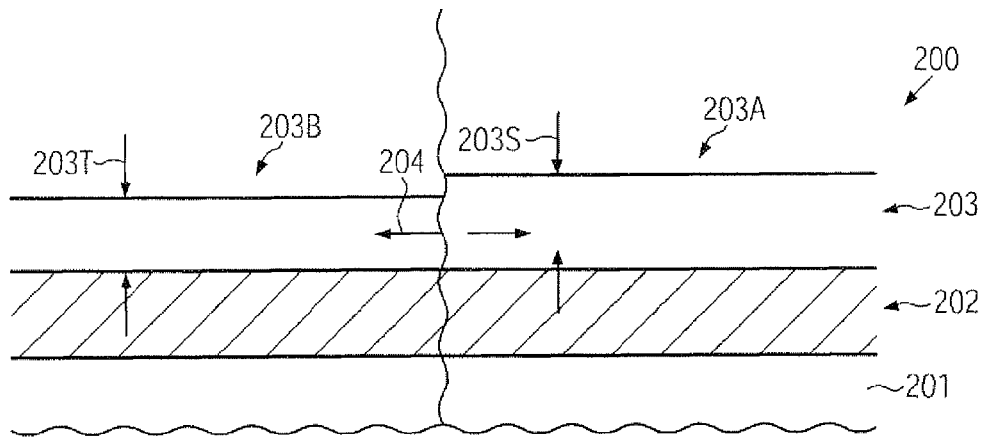
FIG. 2a schematically illustrates a cross-sectional view of a semiconductor device at an early manufacturing stage in which a silicon-based semiconductor layer with different thickness may be provided for enhancing the adjustment of an appropriate aspect ratio for different transistor types, according to illustrative embodiments.

FIG. 2a schematically illustrates a semiconductor device 200 in an early manufacturing stage. As illustrated, the device 200 may comprise a substrate 201 and a buried insulating layer 202 followed by a silicon-based semiconductor layer 203. With respect to these components, the same criteria may apply as previously explained with reference to the semiconductor device 100. For example, the semiconductor layer 203 may comprise a global strain component 204, such as a tensile strain component, in order to enhance performance of N-channel transistors. Moreover, the semiconductor layer 203 may comprise a first region 203A having a thickness 203S, which may be appropriate for adjusting a height-to-length aspect ratio of an active region still to be formed in the area 203A. The semiconductor layer 203 may further comprise a second area 203B having a thickness 203T, which may be appropriate for obtaining a desired height-to-length aspect ratio for preserving a moderately high fraction of the initial strain component 204 in order to enhance performance of N-channel transistors. Consequently, upon the further processing, in addition to or alternatively to selecting different length values for the various active regions, the height levels 203S, 203T may provide an additional degree of freedom in obtaining a desired strain distribution in corresponding active regions. Consequently, appropriate length values may be selected for the area 203A and the area 203B, for instance on the basis of similar strategies as previously discussed in order to form corresponding trench isolation structures on the basis of the desired geometry, thereby resulting in the desired aspect ratio in combination with the thickness values 203S, 203T.

Figure 2B:
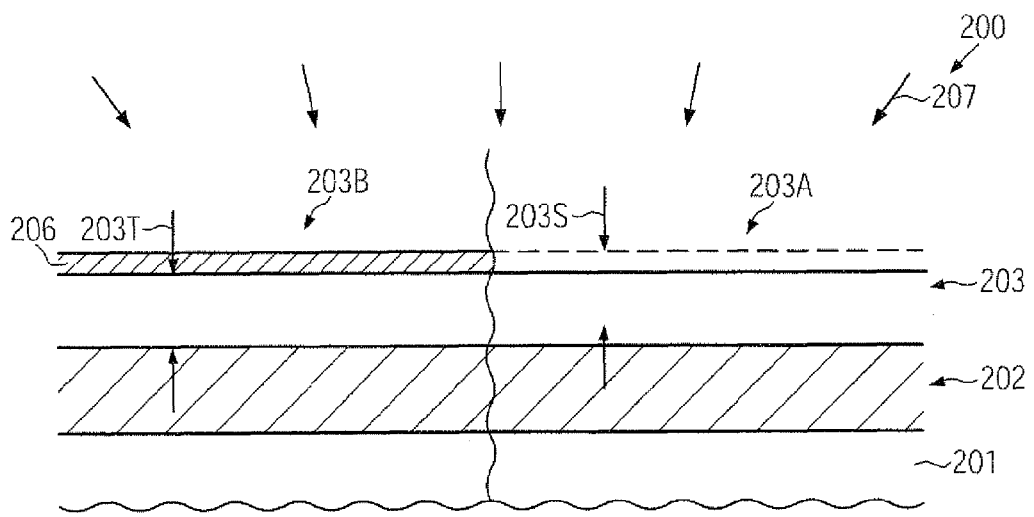
FIGS. 2b-2c schematically illustrate cross-sectional views of the semiconductor device according to different process strategies in providing a local difference in layer thickness, according to illustrative embodiments.

FIG. 2b schematically illustrates the semiconductor device 200 according to illustrative embodiments for providing the different thickness levels 203S, 203T as illustrated in FIG. 2a. As shown, the semiconductor device 200 may comprise the semiconductor layer 203 with a thickness that may substantially correspond to the thickness 203T. Furthermore, a mask layer 206 may be provided so as to cover the area 203B, while exposing the area 203A to a deposition ambient 207, which may be established on the basis of well-established process recipes in order to selectively deposit a semiconductor material, such as a silicon material, a silicon/germanium material and the like. That is, during the deposition process 207, which may also be referred to as a selective epitaxial growth process, semiconductor material may be deposited on exposed semiconductor material surface areas, while a deposition on dielectric surface areas may be substantially suppressed. Consequently, during the process 207, the desired thickness 203S may be obtained in order to provide the desired thickness for obtaining a desired height-to-length aspect ratio during the further processing. It should be appreciated that the mask layer 206 may be provided in the form of any appropriate dielectric material, such as a silicon nitride material, which may be deposited by well-established deposition techniques, followed by a lithography process sequence for patterning the layer 206.

Figure 2C:
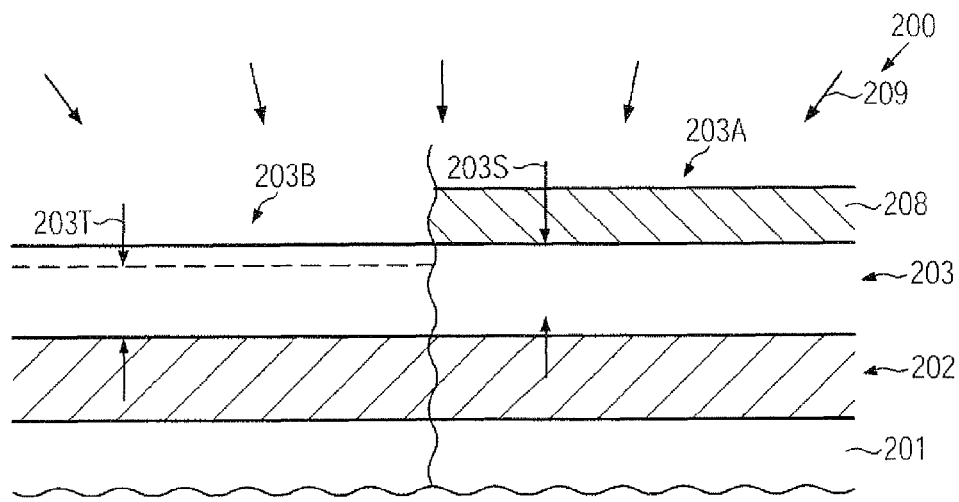

FIG. 2c schematically illustrates the semiconductor device 200 according to further illustrative embodiments in which the semiconductor layer 203 may be provided with a thickness that substantially corresponds to the thickness 203S. Furthermore, an etch mask 208 may be provided so as to cover the area 203A, while exposing the area 203B. The etch mask 208 may represent any appropriate material, for instance, a dielectric material in the form of silicon dioxide, silicon nitride and the like, or any other material, such as resist material and the like, may be used. The etch mask 208 may be formed on the basis of any appropriate patterning techniques, depending on the material used. After exposing the area 203B, a material removal process 209 may be performed in order to reduce the thickness of the layer 203 so as to obtain the desired thickness 203T. For this purpose, any well-established etch recipes may be used in order to remove material of the layer 203. For example, a plurality of wet chemical etch recipes, plasma-assisted etch techniques and the like are available for removing silicon material. In some illustrative embodiments, the mask 208 may represent a non-oxidizable material and the process 209 may include an oxidation process performed in any appropriate oxidizing ambient, such as a wet chemical oxidation ambient, a plasma-assisted ambient, a thermally activated ambient and the like. Consequently, a surface portion of the layer 203 in the area 203B may be converted into an oxide in a very controllable manner, since the oxidation rate may be precisely controllable while also providing a high degree of process uniformity. Thereafter, the process 209 may comprise an etch process for removing oxide material selectively to material of the layer 203, for which purpose well-established process recipes are available. Consequently, the thickness of the area 203B may be reduced in a very controllable manner, thereby resulting in a precisely adjusted height-to-length aspect ratio during the further processing of the device 200.

Figure 2D:
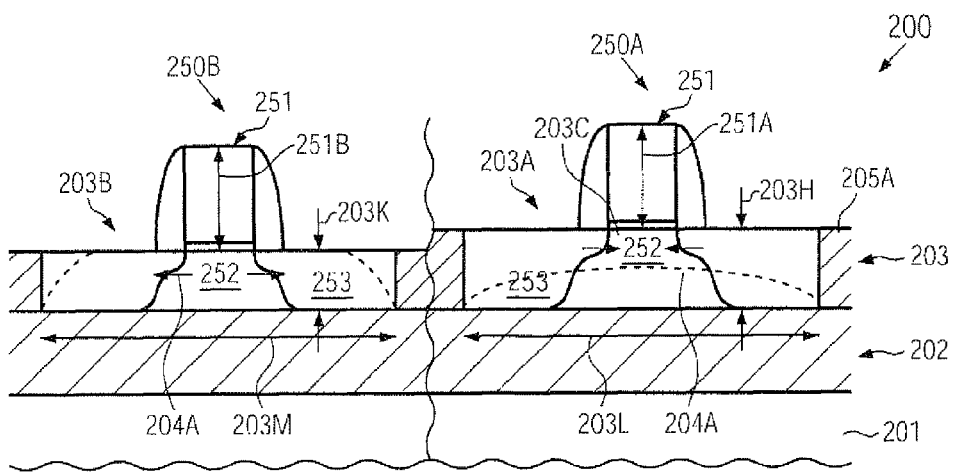
FIG. 2d schematically illustrates the semiconductor device in a further advanced manufacturing stage in which transistors may be formed in and above active regions having different aspect ratios accomplished on the basis of a different height, possibly in combination with a different length, according to still further illustrative embodiments.

FIG. 2d schematically illustrates the semiconductor device 200 in a further advanced manufacturing stage. As illustrated, a first transistor 250A may be formed in and above the first area 203A, which may also be referred to as a first active region, which may be laterally delineated by a first trench isolation structure 205A. The first active region 203A may have a height-to-length aspect ratio defined by a height 203H and a length 203L, which may result in a central surface region having the desired compressive strain component, as previously explained with reference to the semiconductor device 100. Consequently, the central surface region may represent at least a portion of a channel region 252 of the transistor 250A, thereby obtaining a desired increased charge carrier mobility in the channel region 252. Moreover, the transistor 250A may comprise a gate electrode structure 251 which may have any appropriate configuration, as is also previously explained with reference to the semiconductor device 100. Moreover, the semiconductor device 200 may comprise a second transistor 250B formed in and above the area 203B, which may now represent a second active region having a height-to-length aspect ratio that is defined by a height 203K and a length 203M of the active region 203B. Due to the reduced height 203K, the length 203M may also be reduced, for instance compared to a configuration as described with reference to the semiconductor device 100, superior design flexibility in forming N-channel transistors, such as the transistor 250B, may be provided. Moreover, the reduced height 203K may additionally provide superior performance of N-channel transistors, as N-channel transistors may have a superior dynamic and static behavior for otherwise given parameters for a critical dimension of 50 nm and less. Furthermore, due to the reduced height 203K, a moderately high tensile strain component 204A may still exist in the active region 203B even for a moderately small length 203M. Moreover, the transistor 250B may comprise the gate electrode structure 251, wherein, in some illustrative embodiments, a height 251B of the gate electrode structure 251 may differ from a height 251A of the gate electrode structure 251 of the transistor 250A. For example, the gate electrode structures 251 may extend to substantially the same height level so that the difference in the height values 251B, 251A may substantially correspond to the difference of the values 203H, 203K. In other cases, the height values 251B, 251A may be substantially equal, for instance, when the gate electrode structures 251 of the first and second transistors 250A, 250B are patterned in separate patterning sequences.

The semiconductor device 200 as illustrated in FIG. 2d may be formed on the basis of the following processes. After providing the areas 203A, 203B with the different height levels, in some illustrative embodiments, the isolation structures 205A may be formed, for instance, by using a planarization material for compensating for the different height levels in the areas 203A, 203B. In other cases, the difference in the height level may be considered non-critical for the corresponding process sequence for forming the isolation structures 205A. In still other illustrative embodiments, the isolation structures 205A may be formed on the basis of the layer 203 with a substantially uniform thickness and the difference in height level may be adjusted after forming the isolation structures, for instance, by selectively removing material of the active region 203B on the basis of any process technique, as for instance described with reference to FIG. 2c.

Next, the gate electrode structures 251 may be formed by depositing or otherwise forming any required materials, such as a gate dielectric material, an electrode material and the like, wherein additional planarization processes may be performed in order to reduce a height difference between the regions 203A, 203B. Thereafter, the further processing may be continued by patterning the gate layer stack so as to obtain gate electrode structures 251 with the different gate heights 251A, 251B. In other cases, the corresponding gate layer materials may be patterned in separate process sequences, for instance, by masking the area 205A, while patterning the gate material above the area 203B. Thereafter, further processing may be continued by forming drain and source regions 253, as previously described, and forming a contact structure in accordance with well-established process techniques.

As a result, the present disclosure provides manufacturing techniques and semiconductor devices in which superior performance of N-channel transistors and P-channel transistors may be obtained on the basis of a globally strained silicon-based semiconductor material by appropriately adjusting the aspect ratio of active regions in order to obtain appropriate strain distributions in the active regions. Consequently, a single strained semiconductor material may be used to simultaneously enhance performance of N-channel transistors and P-channel transistors, thereby avoiding complex manufacturing strategies requiring high tensile strain levels of the initial semiconductor material, as may be the case in some conventional strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a silicon-containing semiconductor layer above a substrate, said silicon-containing semiconductor layer having a biaxial strain of a first type;
   forming a trench isolation structure in said silicon-containing semiconductor layer so as to define an active region in said silicon-containing semiconductor layer, wherein forming the trench isolation structure changes the biaxial strain in a surface region from the first type to a second type that differs from said first type, while maintaining the first type in other portions of the active region; and
   forming a transistor element of a first conductivity type in and above said active region, said surface region representing a portion of a channel region of said transistor element.

2. The method of claim 1, wherein said silicon-containing semiconductor layer is provided so as to have a biaxial tensile strain, and wherein forming the trench isolation structure changes the biaxial strain in the surface region to a biaxial compressive strain.

3. The method of claim 1, wherein a magnitude of the biaxial strain in the surface region is determined by an aspect ratio of the active region, and further comprising determining a target aspect ratio of the active region so as to obtain a desired strain level in said surface region and forming said isolation trench structure on the basis of said target aspect ratio.

4. The method of claim 1, further comprising forming a second active region so as to maintain said biaxial strain of the first type at least in a central area of said second active region.

5. The method of claim 4, further comprising forming one or more transistor elements of a second conductivity type in and above at least said central area of said second active region.

6. The method of claim 4, wherein said active region and said second active region are formed so as to substantially maintain an initial thickness of said silicon-containing semiconductor layer.

7. The method of claim 4, further comprising increasing a thickness of said silicon-containing semiconductor layer locally in an area corresponding to said active region.

8. The method of claim 4, further comprising reducing a thickness of said silicon-containing semiconductor layer locally in an area corresponding to said second active region.

9. A method, comprising:
   providing a silicon-containing semiconductor layer above a substrate, said silicon-containing semiconductor layer having a biaxial strain of a first type;
   forming a trench isolation structure in said silicon-containing semiconductor layer so as to define an active region having a surface region having a biaxial strain of a second type that differs from said first type, wherein said trench isolation structure is formed so as to extend to a buried insulating layer formed between said substrate and said silicon-containing semiconductor layer; and
   forming a transistor element of a first conductivity type in and above said active region, said surface region representing a portion of a channel region of said transistor element.

10. The method of claim 1, further comprising providing at least one further strain-inducing mechanism for said transistor element of the first conductivity type.

11. A method, comprising:
    forming a first active region and a second active region in a strained silicon-containing semiconductor layer formed above a substrate of a semiconductor device, wherein strain distributions in the first and second active regions are determined by aspect ratios of the first and second active regions, said first active region having a first aspect ratio of height and length so as to obtain a strain component of opposite type relative to an initial type of strain of said silicon-containing semiconductor layer at least in a central surface region of said first active region, said second active region having a second aspect ratio so as to substantially preserve said initial type of strain at least in a central surface region of said second active region;
    forming a first transistor in and above said first active region with a channel region comprising at least a portion of said central surface region of said first active region; and
    forming one or more transistors in and above said second active region with a channel region comprising at least a portion of said central surface region of said second active region.

12. The method of claim 11, wherein forming said first active region comprises adjusting said first aspect ratio by substantially preserving an initial thickness of said silicon-containing semiconductor layer and adapting a length of said first active region.

13. The method of claim 12, wherein forming said second active region comprises adjusting said second aspect ratio by substantially preserving said initial thickness and adapting a length of said second active region, wherein the length of said second active region is greater than the length of said first active region.

14. The method of claim 11, wherein forming said first and second active regions comprises modifying an initial thickness of said silicon-containing semiconductor layer for at least one of said first and second active regions.

15. The method of claim 14, wherein modifying an initial thickness comprises locally increasing said initial thickness in said first active region.

16. The method of claim 14, wherein modifying an initial thickness comprises locally reducing said initial thickness in said second active region.

17. The method of claim 11, wherein said initial type of strain is a tensile strain.

18. The method of claim 17, wherein said first transistor is formed as a P-channel transistor and said one or more second transistors are formed as N-channel transistors.

19. The method of claim 11, wherein forming said first and second active regions comprises forming a first trench isolation structure delineating said first active region and forming a second isolation structure delineating said second active region, wherein said first and second isolation structures extend to a buried insulating layer.

20. The method of claim 1, wherein providing the silicon-containing semiconductor layer having the biaxial strain of the first type comprises providing a silicon-containing semiconductor layer having a tensile strain level of approximately 800-1000 MPa.

21. The method of claim 20, wherein forming the trench isolation structure in the silicon-containing semiconductor layer comprises forming trench isolation structures to define an active region having an aspect ratio of 0.4 to 0.5 so that the surface region has a compressive strain component of several tens of MPa.

22. The method of claim 20, wherein forming the trench isolation structure in the silicon-containing semiconductor layer comprises forming trench isolation structures to define an active region having an aspect ratio of approximately 0.9 to 1.0 so that the surface region has a compressive strain level of approximately 100 MPa.

* * * * *